(12) United States Patent  
Sakaguchi (10) Patent No.: US 8,461,918 B2
(45) Date of Patent: Jun. 11, 2013

(54) SWITCHED CAPACITOR CIRCUIT (75) Inventor: Makoto Sakaguchi, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 141 days.

(21) Appl. No.: 13/018,854

(22) Filed: Feb. 1, 2011

(65) Prior Publication Data

US 2011/0193611 A1 Aug. 11, 2011

(30) Foreign Application Priority Data

Feb. 9, 2010 (JP) ................................. 2010-026441

(51) Int. Cl.
*H03B 1/00* (2006.01)
(52) U.S. Cl.
USPC .......................................... 327/554; 327/558
(58) Field of Classification Search
USPC ................................................... 327/554, 558
See application file for complete search history.

(56) References Cited

U.S. PATENT DOCUMENTS

| 4,894,620 | A | * | 1/1990 | Nagaraj | .......................... 327/91 |
| 5,118,966 | A | | 6/1992 | Kumada | |
| 5,239,210 | A | | 8/1993 | Scott | |
| 5,341,050 | A | * | 8/1994 | Mellissinos et al. | .......... 327/355 |
| 5,475,337 | A | * | 12/1995 | Tatsumi | ......................... 327/551 |
| 5,608,345 | A | * | 3/1997 | Macbeth et al. | ............... 327/337 |
| 6,803,802 | B2 | | 10/2004 | Bae et al. | |
| 8,248,121 | B2 | * | 8/2012 | Lee | ............................... 327/156 |

FOREIGN PATENT DOCUMENTS

| JP | 58-198918 A | 11/1983 |
| JP | 1-286513 A | 11/1989 |
| JP | 5-102740 A | 4/1993 |
| JP | 2003-203195 A | 7/2003 |

* cited by examiner

*Primary Examiner* — Hai L Nguyen
(74) *Attorney, Agent, or Firm* — Foley & Lardner LLP (57) ABSTRACT A switched capacitor circuit includes: an operational amplifier; a first capacitor; a first switch that charges the first capacitor by connecting the first capacitor between an inverting input terminal and an output terminal of the operational amplifier, and discharges the first capacitor by disconnecting the inverting input terminal and the output terminal of the operational amplifier in a predetermined period; and a first output terminal that outputs an output voltage of the switched capacitor circuit, wherein after a predetermined period from a time when the first switch connects the first capacitor between the inverting input terminal and the output terminal of the operational amplifier, the first output terminal and the output terminal of the operational amplifier are connected to each other.

9 Claims, 8 Drawing Sheets

PRIOR ART

Fig. 3A

PRIOR ART

Fig. 3B

PRIOR ART

Fig. 3C

PRIOR ART

Fig. 4A

PRIOR ART

Fig. 4B

PRIOR ART

Fig. 4C

PRIOR ART

Fig. 5A

PRIOR ART

Fig. 5B

SWITCHED CAPACITOR CIRCUIT

CROSS-REFERENCE TO RELATED APPLICATIONS

This application is based upon and claims the benefit of priority from Japanese patent application No. 2010-026441, filed on Feb. 9, 2010, the disclosure of which is incorporated herein in its entirety by reference.

BACKGROUND

1. Field of the Invention

The present invention relates to a switched capacitor circuit.

2. Description of Related Art

In a circuit that handles a high frequency signal, such as a cellular phone, it is necessary to match a characteristic impedance to transmit a signal power efficiently. Matching the characteristic impedance requires an accurate inductor and capacitor. However, a variation in capacitance value becomes a problem in a semiconductor circuit. Therefore, it is necessary to detect the variation in capacitance value. To detect the variation, both a reference capacitor and an object capacitor are configured to act as switched capacitors. Then, an operational amplifier is driven through these equivalent resistors, thereby detecting the variation in capacitance as a voltage.

Figure 3A:
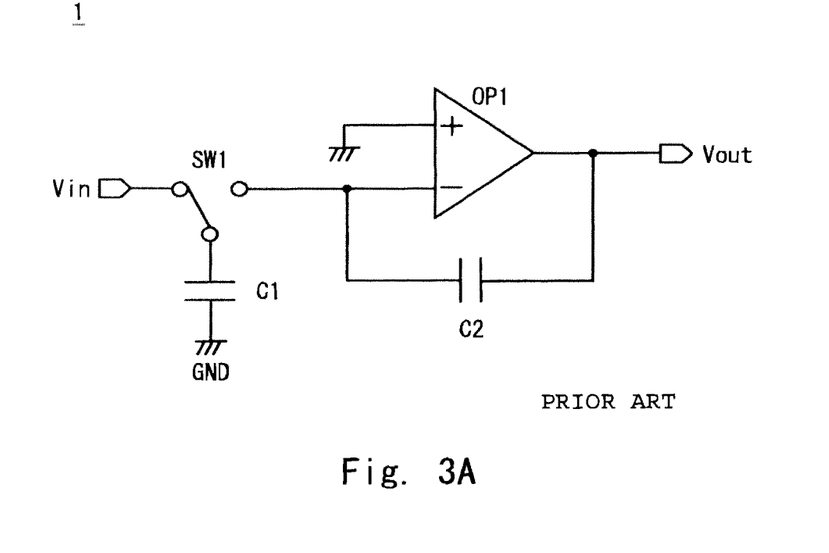
FIG. 3A is a configuration and operation of an integrator using a switched capacitor in accordance with a related art.
Figure 3B:
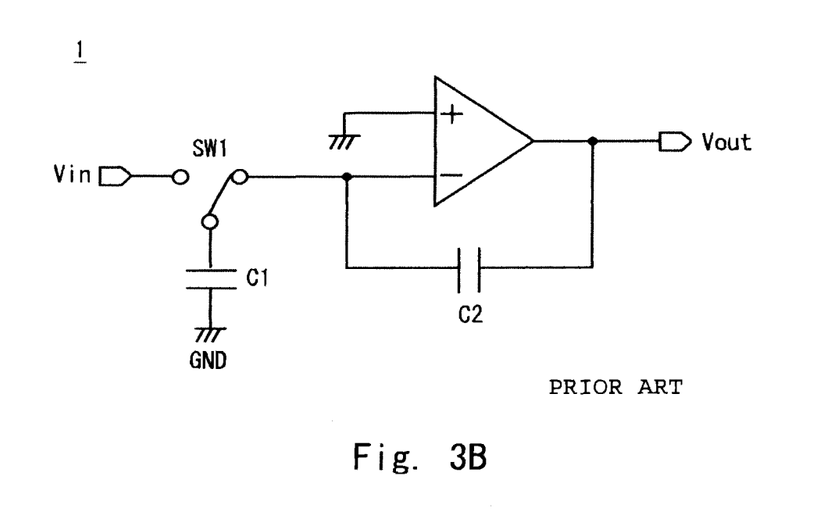
FIG. 3B is another configuration and operation of the integrator using the switched capacitor in accordance with the related art.

FIGS. 3A and 3B show an integrator 1 using a switched capacitor circuit. As shown in FIGS. 3A and 3B, the integrator 1 includes an operational amplifier OP1, a switching capacitor C1, a feedback capacitor C2, and a switch SW1.

An operation of the integrator 1 is explained with reference to FIGS. 3A and 3B. As shown in FIG. 3A, the switch SW1 is connected to a side of an input terminal Vin. Assume that an input voltage Vin is applied to the input terminal Vin. At this time, the switching capacitor C1 is charged according to the voltage Vin.

Referring next to FIG. 3B, the switch SW1 is connected to a side of an inverting input terminal of the operational amplifier OP1. Because voltages at both terminals of the switching capacitor C1 are set to a ground voltage GND, the electric charge stored in the switching capacitor C1 is discharged. In this manner, the switching capacitor C1 is repeatedly charged and discharged by alternately repeating the connection states of FIGS. 3A and 3B. Assuming that a charge and discharge current is represented by Ij and a switching frequency of the switch SW1 is represented by Fs at this time, the following expression (1) holds.

$$Ij = C1 \times Vin \times Fs \quad (1)$$

Figure 3C:
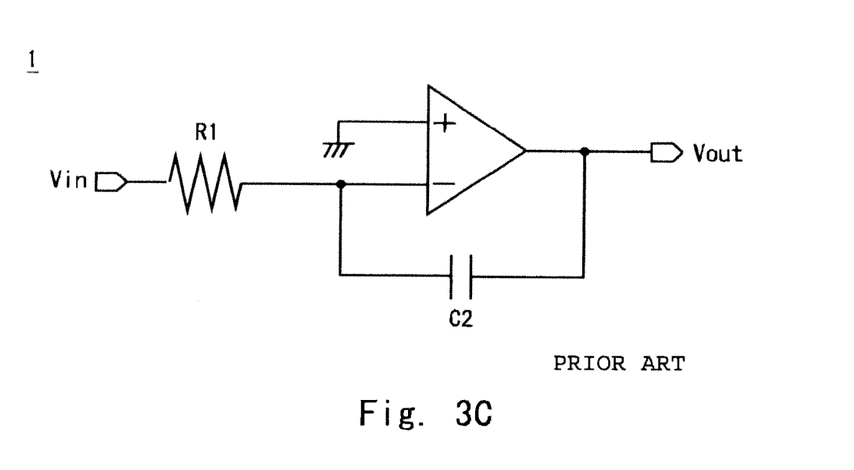
FIG. 3C is still another configuration and operation of the integrator using the switched capacitor in accordance with the related art.

As shown in the expression (1), a constant current flows to the switching capacitor C1. Thus, the switching capacitor C1 can be considered as an equivalent resistance. Therefore, the integrator 1 can be considered as an equivalent circuit like a circuit shown in FIG. 3C. A time constant T of this integrator 1 is represented by the following expression (2). The time constant T depends only on a relative accuracy regardless of an absolute variation of the capacitors C1 and C2.

$$\begin{aligned} T &= R1 \times C2 \quad (2)\\ &= \frac{Vin}{Ij} \times C2\\ &= \frac{Vin}{C1 \times Vin \times Fs} \times C2\\ &= \frac{C2}{C1 \times Fs} \end{aligned}$$

Figure 4A:
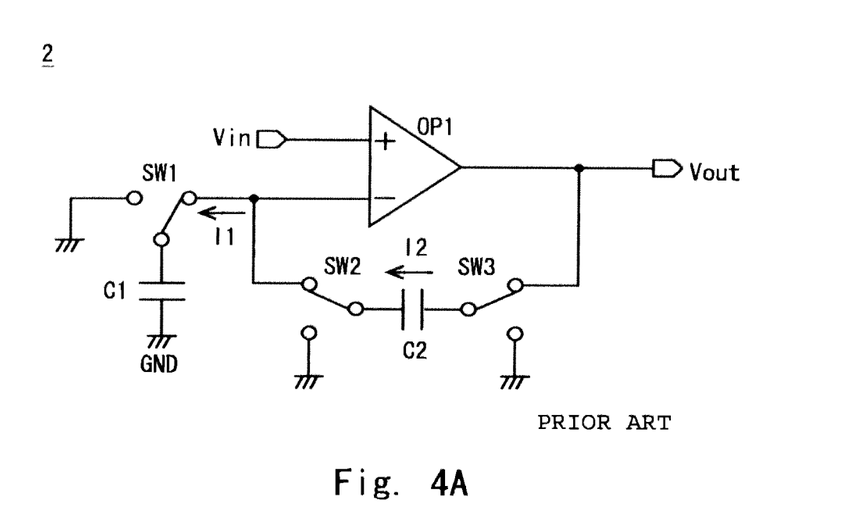
FIG. 4A is a configuration and operation of a voltage amplification circuit using a switched capacitor in accordance with a related art.
Figure 4B:
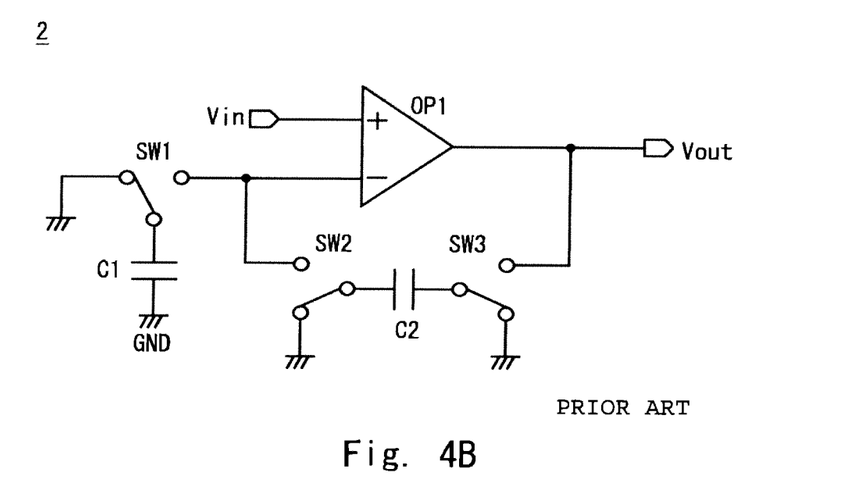
FIG. 4B is another configuration and operation of the voltage amplification circuit using the switched capacitor in accordance with the related art.
Figure 4C:
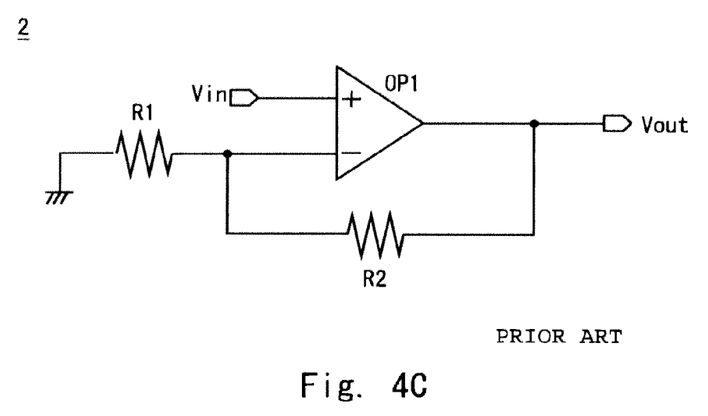
FIG. 4C is still another configuration and operation of the voltage amplification circuit using the switched capacitor in accordance with the related art.

FIGS. 4A to 4C show a voltage amplification circuit 2 using a switched capacitor, in which the configuration of the integrator 1 shown in FIGS. 3A to 3B is changed. As shown in FIGS. 4A and 4C, the voltage amplification circuit 2 includes the operational amplifier OP1, the switching capacitor C1, the feedback capacitor C2, and switches SW1 to SW3.

An operation of the voltage amplification circuit 2 is explained with reference to FIGS. 4A and 4B. As shown in FIG. 4A, the switches SW1 and SW2 are connected to a side of the inverting input terminal of the operational amplifier ON, and the switch SW3 is connected to a side of an output terminal Vout. Assume that an output voltage of the output terminal Vout is represented by Vout. At this time, the capacitors C1 and C2 are charged.

Referring next to FIG. 4B, the switch SW1 is connected to the side of the inverting input terminal, and the switches SW2 and SW3 are connected to the side of the ground terminal GND. Therefore, the electric charge stored in the capacitors C1 and C2 are discharged. A charging current I1 flows to the capacitor C1 and a charging current I2 flows to the capacitor C2, due to the repetition of the charge and discharge. These currents I1 and I2 are expressed by the following expressions (3) and (4), respectively.

$$I1 = C1 \times Vin \times Fs \quad (3)$$

$$I2 = C1 \times (Vout - Vin) \times Fs \quad (4)$$

The capacitors C1 and C2 act as equivalent resistors as seen from the expressions (3) and (4). Then, the voltage amplification circuit 2 can be considered as an equivalent circuit like a circuit shown in FIG. 4C.

When the output voltage Vout at this time is represented by Vin, Expression (5) holds. The output voltage Vout is represented by a capacitance ratio between the capacitors C1 and C2.

$$\begin{aligned} Vout &= Vin \times \frac{R1 + R2}{R1} \quad (5)\\ &= Vin \times \frac{\frac{Vin}{I1} + \frac{Vout - Vin}{I2}}{\frac{Vin}{I1}}\\ &= Vin \times \frac{\frac{1}{C1 \times Fs} + \frac{1}{C2 \times Fs}}{\frac{1}{C1 \times Fs}}\\ &= Vin \times \left(1 + \frac{C1 \times Fs}{C2 \times Fs}\right)\\ &= Vin \times \left(1 + \frac{C1}{C2}\right) \end{aligned}$$

In the manner, assuming that the capacitor C2 is used as a reference capacitor, for example, a capacitor whose variation is to be detected is connected to the capacitor C1. This makes it possible to detect a variation in capacitance as a voltage.

Note that an integrator that uses a switched capacitor is disclosed in Japanese Unexamined Patent Application Publication No. 2003-203195. A technique in which a low-pass filter is connected in cascade with a switched capacitor filter is disclosed in Japanese Unexamined Patent Application Publication No. 58-198918.

SUMMARY

The present inventor has found a problem as described below. The output voltage Vout of the voltage amplification circuit 2 of FIGS. 4A and 4B has no relation with the switching frequency Fs as shown by the expression (5). However, since the switches SW1, SW2, and SW3 are repeatedly switched in an actual circuit operation, the output terminal Vout of the operational amplifier OP1 repeats a connection or an open state with respect to the capacitor C2. Therefore, noise of the switching frequency Fs (hereafter, referred to as switching noise Ns) is superimposed in the same manner as in Japanese Unexamined Patent Application Publication No. 58-198918.

Figure 5A:
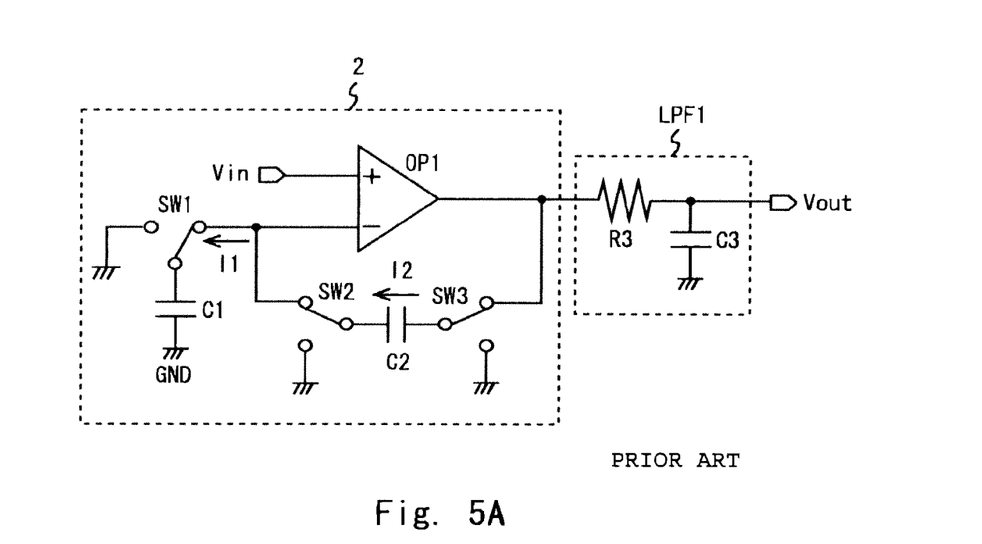
FIG. 5A is a configuration and operation of a switched capacitor circuit in which a low-pass filter is added in accordance with a related art.
Figure 5B:
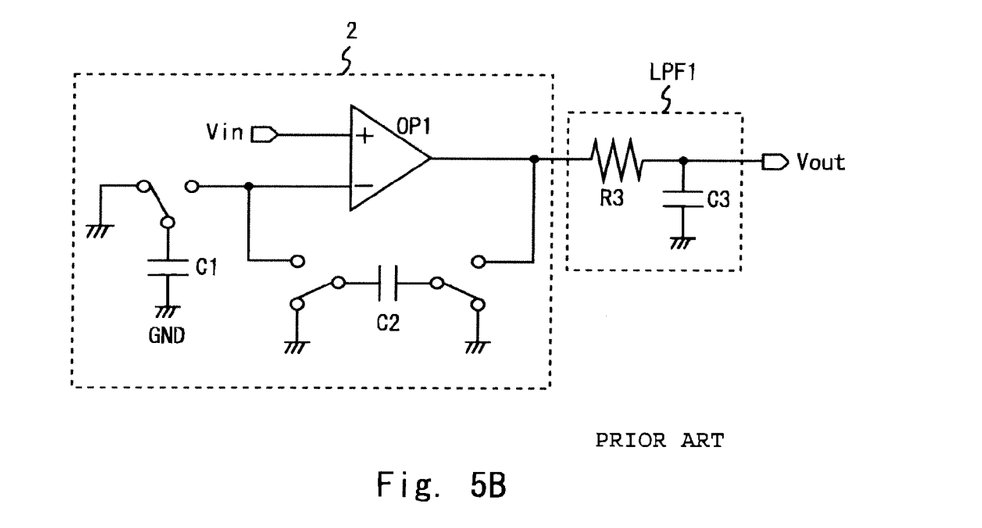
FIG. 5B is another configuration and operation of the switched capacitor circuit in which the low-pass filter is added in accordance with the related art.

Thus, as shown in FIGS. 5A and 5B, it is necessary to insert a low-pass filter LPF1 that includes a resistor R3 and a capacitor C3 between the output terminal of the operational amplifier OP1 and the output terminal Vout to remove the switching noise Ns. In this case, however, it is necessary to increase the order of the low-pass filter LPF1 or to increase the driving ability of the output of the operational amplifier OP1 to sufficiently remove the switching noise Ns. However, this causes an increase in circuit size or current consumption of the operational amplifier OP1.

A first exemplary aspect of the present invention is a switched capacitor circuit including: an operational amplifier; a first capacitor; a first switch that charges the first capacitor by connecting the first capacitor between an inverting input terminal and an output terminal of the operational amplifier, and discharges the first capacitor by disconnecting the first capacitor between the inverting input terminal and the output terminal of the operational amplifier in a predetermined period; and a first output terminal that outputs an output voltage of the switched capacitor circuit, wherein after a predetermined period from a time when the first switch connects the first capacitor between the inverting input terminal and the output terminal of the operational amplifier, the first output terminal and the output terminal of the operational amplifier are connected to each other.

A second exemplary aspect of the present invention is a switched capacitor circuit that amplitudes an input voltage and outputs at an first output terminal, including: an operational amplifier having a non-inverting terminal receiving the input voltage, an inverting terminal connected with a first node, and an output terminal connected with a second node; a first capacitor connected between a third node and a fourth node; a second capacitor connected between a fifth node and a ground terminal; a third capacitor connected between a sixth node and the ground terminal; a low-pass filter connected between the sixth node and the first output terminal; a first switch that switches a connection between the first node and the third node, or a connection between the third node and the ground terminal in a first predetermined period; a second switch that operates in synchronization with the first switch and switches a connection between the second node and the fourth node, or a connection between the fourth node and the ground terminal in the first predetermined period; a third switch that connects the second node with the sixth node from an open state after a second predetermined period from a time when the second switch connects the second node and the fourth node; and a fourth switch that switches a connection between the first node and the fifth node, or a connection between the fifth node and the ground terminal in the first predetermined period.

In the switched capacitor circuit according to the first exemplary aspect of the present invention, the first switch connects the output terminal of the switched capacitor circuit and the output terminal of the operational amplifier after a predetermined time after the first switch connects the first capacitor between the inverting input terminal and output terminal of the operational amplifier. As a result, the noise which is generated during switching of the first switch and output from the operational amplifier is attenuated, and when the output voltage of the operational amplifier reaches a predetermined value, the output terminal of the switched capacitor circuit and the output terminal of the operational amplifier can be connected together. This prevents transmission of the noise to the output terminal of the switched capacitor circuit. Therefore, it is possible to lower the order of the low-pass filter for attenuating the noise, and there is no need to use a high-performance operational amplifier which has higher power consumption.

The switched capacitor circuit according to an exemplary aspect of the present invention can remove the switching noise without increasing the order of the low-pass filter and without increasing the current consumption of the operational amplifier.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION

An exemplary embodiment of the present invention will be described in detail below with reference to the accompanying drawings. In this exemplary embodiment, a switched capacitor circuit according to the present invention is applied to a voltage amplification circuit 100.

Figure 1A:
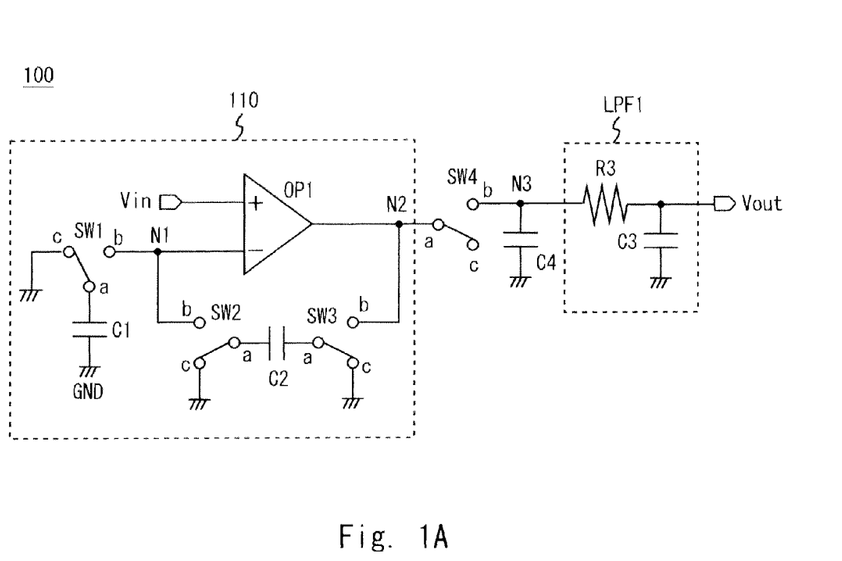
FIG. 1A is an exemplary configuration and operation of a switched capacitor in accordance with an exemplary embodiment of the present invention.
Figure 1B:
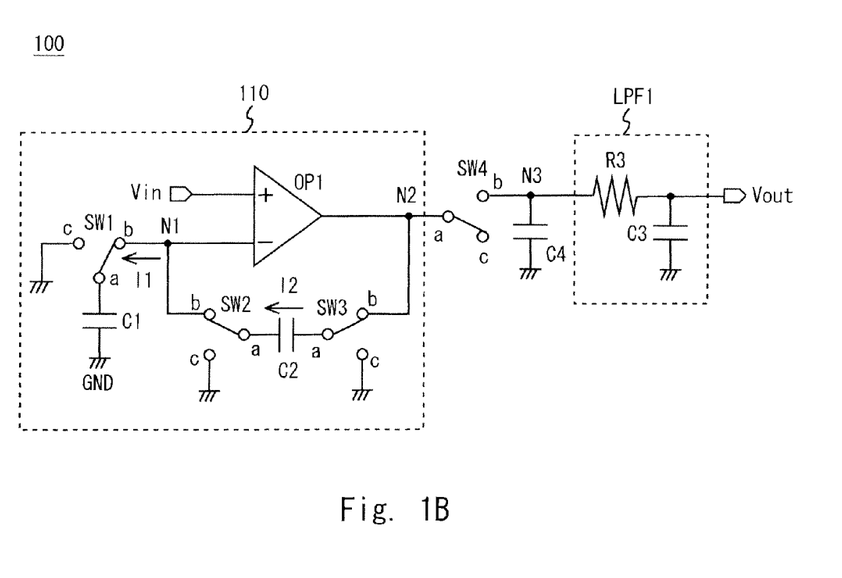
FIG. 1B is another exemplary configuration and operation of the switched capacitor in accordance with an exemplary embodiment of the present invention.
Figure 1C:
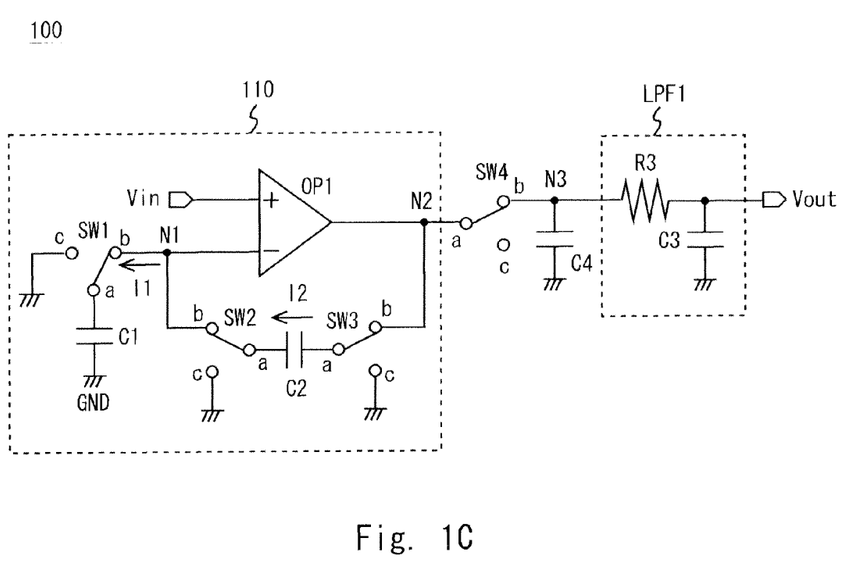
FIG. 1C is still another exemplary configuration and operation of the switched capacitor in accordance with an exemplary embodiment of the present invention.

FIGS. 1A to 1C each show an exemplary configuration and operation of the voltage amplification circuit 100 in accordance with this exemplary embodiment. As shown in FIGS. 1A to 1C, the voltage amplification circuit 100 includes an operational amplifier OP1, capacitors C1, C2, and C4, switches SW1 to SW4, a low-pass filter LPF1, an input terminal Vin, and an output terminal Vout.

The low-pass filter LPF1 includes a capacitor C3 and a resistor R3.

The operational amplifier OP1 has a non-inverting input terminal connected to the input terminal Vin, an inverting input terminal connected to a node N1, and an output terminal connected to a node N2. Hereinafter, a voltage output from the output terminal of the operational amplifier OP1 is represented by Vop.

The switch SW1 has a terminal "a" connected to one of terminals of the capacitor C1, a terminal "b" connected to the node N1, and a terminal "c" connected to a ground terminal GND. The switch SW1 connects between the terminal "a" and the terminal "b", or between the terminal "a" and the terminal "c" according to a control signal S1. For instance, when the control signal S1 of a low level is input, the terminal "a" and terminal "b" are connected. Moreover, when the control signal S1 of a high level is input, the terminal and terminal "c" are connected.

The capacitor C1 has one terminal connected to the terminal "a" of the switch SW1 and the other terminal connected to the ground terminal GND.

The switch SW2 has a terminal "a" connected to one terminal of the capacitor C2, a terminal "b" connected to the node N1, and a terminal "c" connected to the ground terminal GND. The switch SW2 connects between the terminal "a" and the terminal "b", or between the terminal "a" and the terminal "c" according to a control signal S2. For instance, when the control signal S2 of the low level is input, the terminal "a" and terminal "b" are connected. Moreover, when the control signal S2 of the high level is input, the terminal "a" and terminal "c" are connected.

The capacitor C2 has one terminal connected to the terminal "a" of the switch SW2 and the other terminal connected to the terminal of the switch SW3.

The switch SW3 has a terminal "a" connected to the other terminal of the capacitor C2, a terminal "b" connected to the node N2, and a terminal "c" connected to the ground terminal GND. The switch SW3 connects between the terminal "a" and the terminal "b", or between the terminal "a" and the terminal "c" according to a control signal S3. For instance, when the control signal S3 of the low level is input, the terminal "a" and terminal "b" are connected. Moreover, when the control signal S3 of the high level is input, the terminal "a" and terminal "c" are connected.

The switch SW4 has a terminal "a" connected to the node N2, a terminal "b" connected to a node N3. A terminal "c" of the switch SW4 is open. The switch SW4 connects between the terminal "a" and the terminal "b", or between the terminal "a" and the terminal "c" according to a control signal S4. For instance, when the control signal S4 of the low level is input, the terminal "a" and terminal "b" are connected. Moreover, when the control signal S4 of the high level is input, the terminal "a" and terminal "c" are connected.

The capacitor C4 has one terminal connected to the node N3 and the other terminal connected to the ground terminal GND.

The resistor R3 has one terminal connected to the node N3 and the other terminal connected to the output terminal Vout.

The capacitor C3 has one terminal connected to the output terminal Vout and the other terminal connected to the ground terminal GND.

Figure 2:
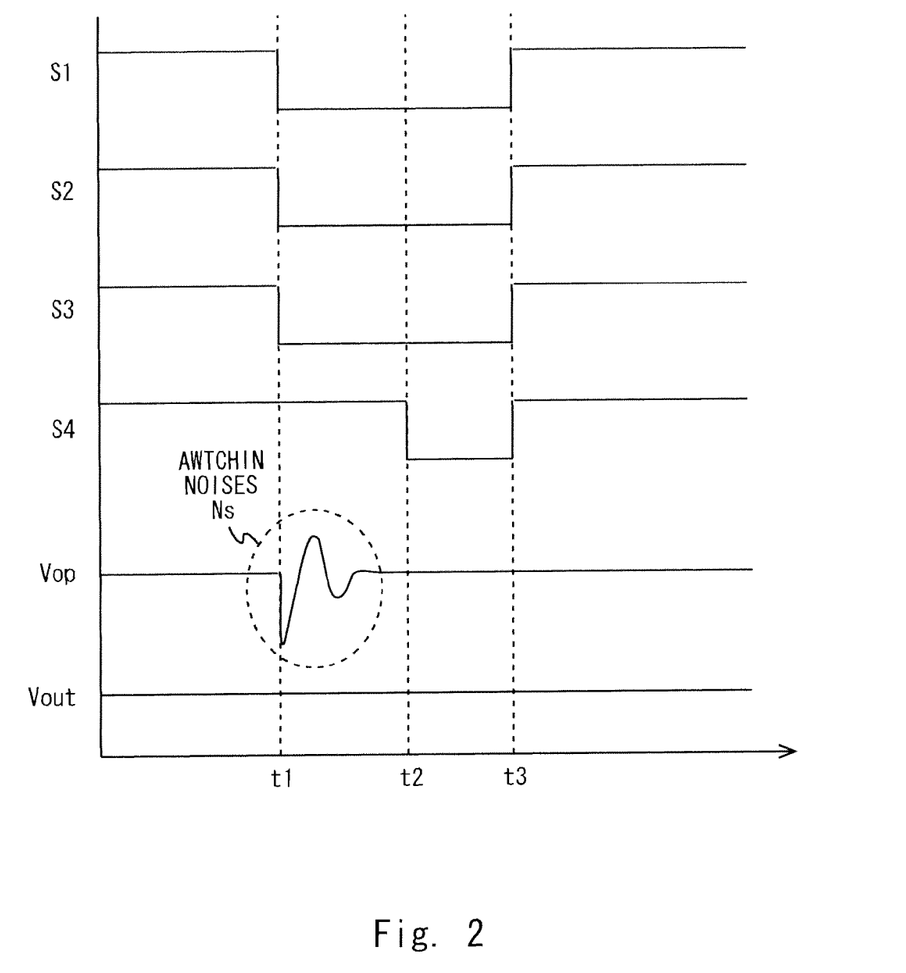
FIG. 2 is a timing diagram showing operation of the switched capacitor in accordance with an exemplary embodiment of the present invention.

An operation of the voltage amplification circuit 100 is described with reference to FIGS. 1A to 1C and FIG. 2. FIG. 2 is a timing diagram that shows the operation of the voltage amplification circuit 100. Note that a circuit unit 110 shown in FIGS. 1A to 1C is basically similar in configuration to the voltage amplification circuit 2. Therefore, the operation of the circuit unit 110 is also basically similar to that described above with reference to FIGS. 4A to 4C. Therefore, an explanation of a detailed operation of the circuit unit 110 is omitted, and operation different from that of the voltage amplification circuit 2 is mainly described in this exemplary embodiment.

First, the control signals S1 to S4 are all at a high level before a time t1, as shown in FIG. 2. As shown in FIG. 1A, the terminal "a" and the terminal "c" of each of the switches SW1 to SW4 are connected.

Next, the control signals S1 to S3 are at a low level at the time t1, as shown in FIG. 2. As shown in FIG. 1B, the terminal "a" and the terminal "b" of each of the switches SW1 to SW3 are connected. Here, at the time t1, the output terminal of the operational amplifier OP1 is electrically connected with the non-inverting input terminal via the capacitor C2 from an open state. Therefore, as shown in FIG. 2, the voltage Vop output from the output terminal of the operational amplifier OP1 has a disturbed waveform. Thus, a similar switching noise Ns similar to that described above with reference to FIGS. 4A and 4B is generated.

However, because the control signal S4 remains at the high level, the terminal "a" and the terminal "c" of the switch SW4 are connected. Therefore, the low-pass filter LPF1 and the node N2 are electrically disconnected, thereby preventing the switching noise Ns from being transmitted to the low-pass filter LPF1.

Next, at a time t2 after a predetermined period from the time t1 in FIG. 2, the control signal S4 also becomes low level. Therefore, as shown in FIG. 1C, the terminal "a" and the terminal "b" of each of the switches SW1 to SW4 are connected. Accordingly, the node N2 and N3 are electrically connected, and the voltage Vop output from the output terminal of the operational amplifier OP1 is transmitted to the low-pass filter LPF1. At the time t2, the voltage Vop has no such a disturbed waveform as described above. Thus, no waveform disturbance occurs in the output voltage Vout output from the output terminal Vout of the voltage amplification circuit 100.

Next, all the control signals S1 to S4 become high level at a time t3 in FIG. 2. Therefore, the terminal "a" and the terminal "c" of each of the switches SW1 to SW4 are connected, thereby restoring the configuration as shown in FIG. 1A.

Then, the voltage amplification circuit 100 repeats the operation described above. This makes it possible to detect a variation in capacitance as a voltage, assuming the capacity C2 is used as a reference capacitor and a capacitor whose variation is to be detected is connected to the capacitor C1.

Here, in the voltage amplification circuit 2 that uses the switched capacitor circuit of the related art, the switching noise is superimposed on the output voltage of the operational amplifier OP1 and output. It is necessary to connect the low-pass filter LPF1 shown in FIG. 5 to remove this switching noise. In this case however, it is necessary to increase the amount of attenuation of the low-pass filter LPF1. Therefore, there is a need to increase the size of the resistor R3 and the capacitor C3 that constitute the low-pass filter LPF1, or to increase the order of the low-pass filter LPF1. This results in increased circuit size.

Moreover, it is necessary to increase a response speed of the operational amplifier OH when the amount of attenuation of the low-pass filter LPF1 cannot be increased, and to rapidly settle the waveform disturbance of the output voltage of the operational amplifier OP1. This requires an increase in driving ability of the output of the operational amplifier OP1, leading to an increase in current consumption of the operational amplifier OP1.

Here, as shown in FIGS. 1B and 2, the terminal "a" of the switch SW4 is connected with the terminal "c" thereof, and the node N2 and N3 are electrically disconnected in the voltage amplification circuit 100 that uses the switched capacitor circuit of this exemplary embodiment, during a period in which the waveform of the output voltage Vop of the operational amplifier OP1 is disturbed. Then, as shown in FIG. 1C, the terminal "a" of the switch SW4 is connected with the terminal "b" thereof after the output voltage Vop of the operational amplifier OP1 reaches a predetermined voltage, and the nodes N2 and N3 are electrically connected. This prevents a great disturbance in waveform of the output voltage Vop of the operational amplifier OP1 from being transmitted to the low-pass filter LPF1.

Consequently, the amount of attenuation of the low-pass filter LPF1 can be reduced, so that the capacitor C3 and the resistor R3 that constitute the low-pass filter LPF1 can be reduced in size. Alternatively, the order of the low-pass filter can be lowered, which makes it possible to employ a one-order low-pass filter like the low-pass filter LPF1. This results in suppressing an increase in the size of the voltage amplification circuit 100.

Ideally, it is also possible to omit the low-pass filter LPF1. However, it is necessary to leave the low-pass filter LPF1 because, in practice, a waveform disturbance occurs during switching of the switch SW4. Further, the capacity C4 is required to maintain the input voltage of the low-pass filter LPF1 while the switch SW4 is in the open state.

Moreover, an output response of the operational amplifier OP1 can be suppressed in this exemplary embodiment. This means that the time t2 is delayed. In other word, a time period between the time t1 and the time t2 can be increased to such extent as to settle the waveform disturbance of the voltage Vop. Therefore, it is possible to suppress a bias current of an output stage of the operational amplifier OP1, and to suppress the current consumption of the operational amplifier OP1. Furthermore, a time constant in phase compensation can be sufficiently increased, thereby stabilizing the circuit.

Note that the present invention is not limited to the exemplary embodiments described above.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A switched capacitor circuit comprising:
   an operational amplifier;
   a first capacitor;
   a first switching circuit that charges the first capacitor by connecting the first capacitor between an inverting input terminal and an output terminal of the operational amplifier, and discharges the first capacitor by disconnecting the first capacitor between the inverting input terminal and the output terminal of the operational amplifier in a predetermined period;
   a first output terminal that outputs an output voltage of the switched capacitor circuit;
   a second switching circuit that is connected between the first output terminal and the output terminal of the operational amplifier, and connects the first output terminal with the output terminal of the operational amplifier after the predetermined period from a time when the first switching circuit connects the first capacitor between the inverting input terminal and the output terminal of the operational amplifier, and
   a low-pass filter that is connected between the second switching circuit and the first output terminal,
   wherein after the predetermined period from a time when the first switching circuit connects the first capacitor between the inverting input terminal and the output terminal of the operational amplifier, the first output terminal and the output terminal of the operational amplifier are connected to each other.

2. The switched capacitor circuit according to claim 1, further comprising a second capacitor that is connected to a first node between the second switching circuit and between the low-pass filter and a ground terminal.

3. The switched capacitor circuit according to claim 2, wherein
   the low-pass filter further comprises a third capacitor,
   the first resistor is connected between the first node and the first output terminal, and
   the third capacitor is connected between the first output terminal and the ground terminal.

4. The switched capacitor circuit according to claim 1, further comprising a fourth capacitor and a third switching circuit, wherein
   a non-inverting terminal of the operational amplifier receives an input voltage of the switched capacitor circuit,
   the fourth capacitor is connected between the third switching circuit and a ground terminal, and
   the third switching circuit uses the switched capacitor circuit as a voltage amplification circuit by connecting the fourth capacitor between the inverting input terminal of the operational amplifier and the ground terminal to charge the fourth capacitor, or by connecting both terminals of the fourth capacitor with the ground terminal to discharge the fourth capacitor in the predetermined period.

5. The switched capacitor circuit according to claim 1, wherein the first switching circuit connects both terminals of the first capacitor with a ground terminal while disconnecting the first capacitor between the inverting input terminal and the output terminal of the operational amplifier.

6. The switched capacitor circuit according to claim 5, wherein the first switching circuit comprises a pair of switches that operate synchronously and are respectively connected to both terminals of the first capacitor.

7. The switched capacitor circuit according to claim 1, wherein the low-pass filter is a first-order filter.

8. A switched capacitor circuit that amplifies an input voltage and outputs an output voltage from a first output terminal, comprising:

an operational amplifier having a non-inverting terminal receiving the input voltage, an inverting terminal connected with a first node, and an output terminal connected with a second node;

a first capacitor connected between a third node and a fourth node;

a second capacitor connected between a fifth node and a ground terminal;

a third capacitor connected between a sixth node and the ground terminal;

a low-pass filter connected between the sixth node and the first output terminal;

a first switching circuit that switches a connection between the first node and the third node, or a connection between the third node and the ground terminal in a first predetermined period;

a second switching circuit that operates in synchronization with the first switching circuit and switches a connection between the second node and the fourth node, or a connection between the fourth node and the ground terminal in the first predetermined period;

a third switching circuit that connects the second node with the sixth node from an open state after a second predetermined period from a time when the second switching circuit connects the second node and the fourth node; and a fourth switching circuit that switches a connection between the first node and the fifth node, or a connection between the fifth node and the ground terminal in the first predetermined period.

9. The switched capacitor circuit according to claim 8, wherein the low-pass filter is a first-order filter.

* * * * *